United States Patent [19]

Minei et al.

[11] Patent Number: 5,131,272
[45] Date of Patent: Jul. 21, 1992

[54] PORTABLE DEPLOYABLE AUTOMATIC TEST SYSTEM

[75] Inventors: Anthony J. Minei, Freeport; John R. Franco, Lake Ronkonkoma; Anthony Russo, Patchogue; Jerard Dietrich, West Babylon, all of N.Y.

[73] Assignee: Harris Corporation, Syosset, N.Y.

[21] Appl. No.: 494,235

[22] Filed: Mar. 15, 1990

[51] Int. Cl.⁵ ................ G01R 31/28; G01D 11/24
[52] U.S. Cl. .................................... 73/431; 73/1 R; 324/73.1; 324/158 F; 361/395
[58] Field of Search ............... 73/866.1, 866.3, 865.9, 73/431, 1 R; 361/392, 393, 394, 395, 396; 324/73.1, 158 F, 156, 74, 555, 556, 557, 558, 559; 371/15.1

[56] References Cited

U.S. PATENT DOCUMENTS

| | | | |
|---|---|---|---|
| 2,723,368 | 11/1955 | Curtis et al. | 361/393 |
| 2,940,017 | 6/1960 | Murphy et al. | 361/394 |
| 2,976,806 | 3/1961 | Risk et al. | 361/394 |
| 3,299,403 | 1/1967 | Young | 361/393 X |
| 3,496,464 | 2/1970 | Tankersley | 324/73.1 |
| 3,586,917 | 6/1971 | Oates | 361/394 X |
| 4,028,536 | 6/1977 | Woodward | 73/1 E X |
| 4,348,759 | 9/1982 | Schnurmann | 324/73.1 X |
| 4,397,021 | 8/1983 | Lloyd et al. | 371/20 |
| 4,402,055 | 8/1983 | Lloyd et al. | 364/579 |
| 4,630,224 | 12/1986 | Sollman | 364/550 |
| 4,656,632 | 4/1987 | Jackson | 371/20 |
| 4,680,674 | 7/1987 | Moore | 361/395 |
| 4,700,293 | 10/1987 | Grone | 324/73.1 X |
| 4,719,459 | 1/1988 | Kovacs et al. | 324/73.1 X |
| 4,736,374 | 5/1988 | Kump et al. | 371/20 |
| 4,752,825 | 6/1988 | Buckley et al. | 358/139 |
| 4,760,329 | 7/1988 | Andreano | 324/73 R |
| 4,825,151 | 4/1989 | Aspelin | 324/73 R |
| 4,841,456 | 6/1989 | Hogan, Jr. et al. | 364/550 |
| 4,847,795 | 7/1989 | Baker et al. | 364/579 |
| 4,985,845 | 1/1991 | Götz et al. | 361/394 X |

FOREIGN PATENT DOCUMENTS

| | | | |
|---|---|---|---|
| 66012 | 4/1983 | Japan | 73/431 |
| 643660 | 6/1984 | Switzerland | 73/431 |
| 2100064 | 12/1982 | United Kingdom | 361/393 |
| 2140355 | 11/1984 | United Kingdom | 361/394 |

OTHER PUBLICATIONS

EH Automated IC Test System Series 4500 Brochure; 8 pages; by E-H Research Laboratories, Inc. of Oakland, Calif.; received in PTO by May 1973.

Primary Examiner—Tom Noland
Attorney, Agent, or Firm—Scully, Scott, Murphy & Presser

[57] ABSTRACT

A portable automatic test system which is deployable as separate modular elements in a plurality of separate protected transit cases, which after removal of the case covers, are stacked one upon the other to form the final test system. All electrical connections between adjacent modular elements are by zero insertion force connectors or low insertion force connectors positioned between the top and bottom of the adjacent elements. Moreover, the electronic components of each element are readily available through a file drawer design allowing ready access to individual printed circuits boards therein. The system controller also functions in a dual role, serving also as a portable maintenance aid. Moreover, the interconnect elements to the unit under test are passive, removing all active circuitry therefrom, and the passive interconnect elements are designed to fit in two 180 degree displaced positions, thereby minimizing the number of passive interconnect elements required to service the many weapon replaceable assemblies of a particular weapons system.

10 Claims, 6 Drawing Sheets

PORTABLE DEPLOYABLE AUTOMATIC TEST SYSTEM

BACKGROUND OF THE INVENTION

1. Field of the Invention

The present invention relates generally to a portable and deployable automatic test system for field testing of electronic weapons systems. More particularly, the subject invention pertains to a portable and deployable automatic test system for the forward field testing of electronic weapons systems, which is deployable in a plurality of separate protected transit cases, which after removal of the case covers, are stacked one upon the other to form the final test system.

2. Discussion of the Prior Art

The increasing complexity of military systems has made the issue of diagnosis and repair of operational problems therein more difficult. Built-in-test (BIT) systems have false alarm rates of up to 50%, and automatic test equipment and test programs can cost millions of dollars per weapon system. Moreover, technical manuals are frequently so large and poorly organized that they are often ignored by technicians.

The U.S. Navy has supported and developed an Integrated Diagnostic Support System (IDSS) which provides a more structured solution to diagnosis and maintenance deficiencies. Providing a diagnostic capability for the support of modern weapon systems requires a broad spectrum of trained personnel, hardware, software, and documentation. The responsibility for providing these capabilities is often dispersed over a wide range of disciplines and organizations, and while each island of technology has done its best within its own scope, little has been done to integrate these activities in a cohesive and coherent way.

Too much is often expected of a single technology or maintenance level, and instead of exploiting the complementary strengths of a range of maintenance technologies, the technician in the field is frequently presented with a bewildering array of tools and documents for a system which is difficult and costly to diagnose. Although some improvements have been made through the use of independent technological solutions, the military still has many maintenance problems. Ships, aircraft, missiles, and control centers are still plagued with untraceable troubles and marginally performing equipment which require a repair echelon other than the on site force to correct.

The U.S. Navy Integrated Diagnostic Support System is a system concept which provides an approach to a solution to the diagnostic and maintenance deficiencies in present weapon systems support by focusing and exploiting the complementary strength of a broad spectrum of maintenance technologies. The Integrated Diagnostic Support System is an institutionalized system of standards, guides, specifications, and tools which defines, mandates, and supports a structured process of maximizing diagnostic effectiveness. The Integrated Diagnostic Support System is applicable to all weapons systems, both electronic and nonelectronic, and the features thereof are designed to work in concert with one another over the full life cycle of the weapons system.

The present invention is designed to provide a deployable and portable automatic test system for the field testing of electronic weapons systems, and is designed to operate and provide support within the framework of the Integrated Diagnostic Support System.

A typical prior art test sequence frequently consisted of a rigid, fixed sequence test strategy that could not be altered at run time to take advantage of increased knowledge about the performance and history of the unit under test. This would result in entire test programs being run for every possible fault, with a possible worst case scenario being that the last test in the strategy is the only test required to detect the faulty component.

In general, the prior art discloses a variety of automatic test equipment, some specifically disclosed as being portable, for units under test in weapons system and for electronic packages in general. However, prior art patents in this field generally concentrate on the electronic approaches therein, and aside from mentioning portability in general, do not disclose specific details of the packaging of the electronics to enable portability and deployment of the test equipment.

SUMMARY OF THE INVENTION

Accordingly, it is a primary object of the present invention to provide a portable and deployable automatic test system for field testing of electronic weapons systems.

A further object of the subject invention is the provision of a portable and deployable automatic test system for the forward field testing of electronic weapons systems, which is deployable in a plurality of separate protected transit cases, which after removal of the case covers, are stacked one upon the other to provide the electrical connections therebetween and form the final test system.

A further object of the subject invention is the adaptive nature of the deployable automatic test system software that is embodied within the system controller module.

In accordance with the teachings herein, the present invention provides a portable and deployable automatic test system comprising a plurality of modular instrument elements, at least one modular switching element, and a modular controller element. Each of the modular elements is closed by at least one cover for shipping and deployment, which is removed for assembly of the system, with the modular elements being assembled by being stacked one upon the other. The modular elements include corresponding and aligned electrical connectors such that electrical signals are passed therebetween by the connectors which are coupled together by stacking of the adjacent modular elements. The electrical connectors include both zero insertion force connectors for low or medium frequency signals of low current, and low insertion force connectors for high frequency, controlled impedance, and high current signals.

In greater detail, the system includes first and second switching interface elements, with the first switching interface element being for low frequency signals, and the second switching interface element being for radio frequency signals. The first switching interface element provides switching between general test instruments and a unit under test, and the second switching interface element provides switching between radio frequency instruments and a unit under test and includes coaxial and waveguide inputs and outputs.

One particularly advantageous feature of the present invention is that the system controller modular element also functions as a portable maintenance aid to provide portable testing and maintenance as a stand-alone unit. The system also includes a plurality of passive interconnection elements, with each passive interconnection element in use being placed upon and coupled to a switching interface element in either one of two 180 degree positions, thereby doubling the inputs/outputs available through the passive interconnection element to support testing of a weapons replaceable assembly placed thereon. The passive interconnection element provides radio frequency switching, cross-point switching, and digital stimulus and response.

One of the instrument elements includes a calibration module, provided for calibration of the electronics in the instrument elements. Moreover, the instrument elements include a front drawer design which opens to allow access to replaceable electronic modules positioned therein. Data storage for the system is provided by an optical disk reader on the system controller for reading information stored on optical disk cartridges, to eliminate hardcopy documentation and provide an electronic data delivery system.

BRIEF DESCRIPTION OF THE DRAWINGS

The foregoing objects and advantages of the present invention for a portable and deployable automatic test system may be more readily understood by one skilled in the art with reference being had to the following detailed description of a preferred embodiment thereof, taken in conjunction with the accompanying drawings wherein like elements are designated by identical reference numerals throughout the several views, and in which.

DETAILED DESCRIPTION OF THE DRAWINGS

Figure 1:
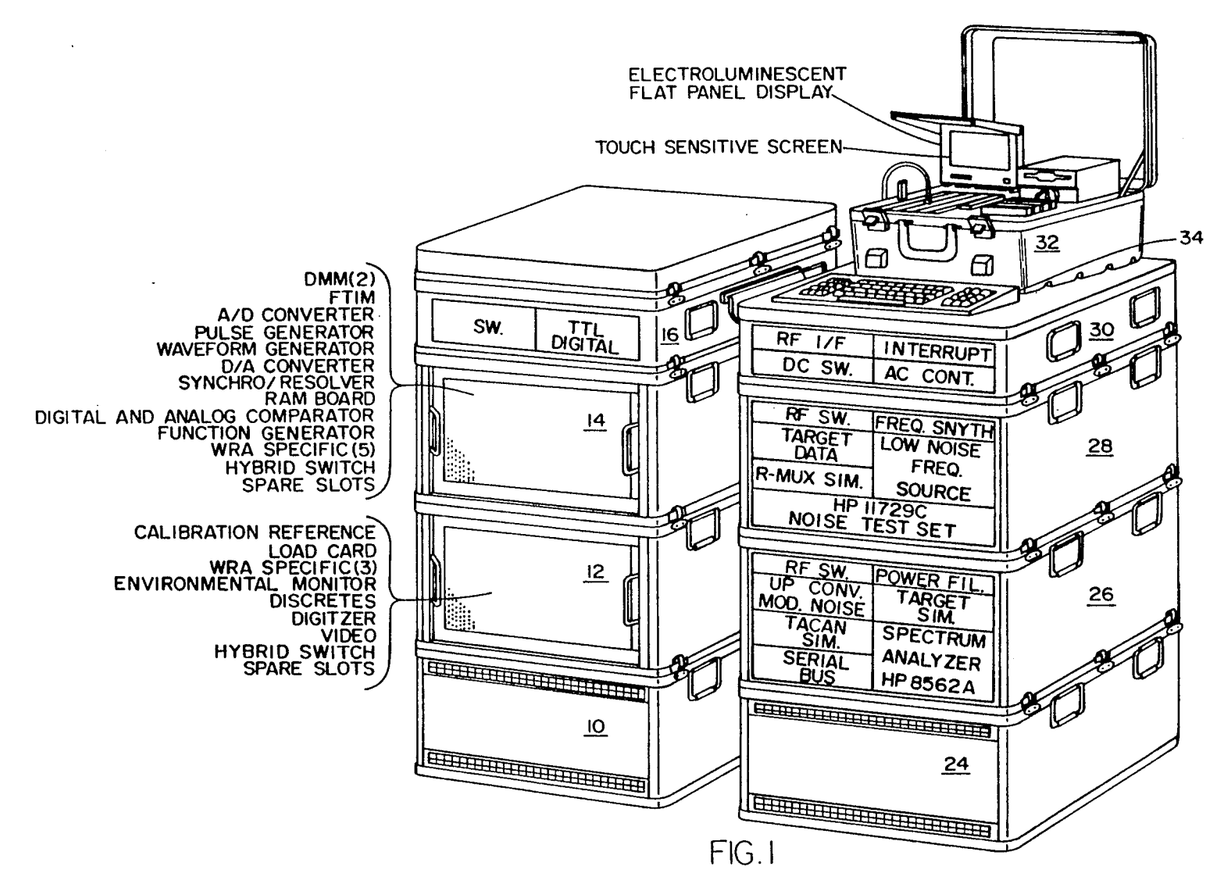
FIG. 1 illustrates an assembled embodiment of the present invention comprising six instrument elements, two switch interface elements, and a system controller/portable maintenance aid.

The deployable portable automatic test system illustrated in FIG. 1 is a self contained system consisting of six instrument elements, two switch interface or interconnection elements, and a system controller/portable maintenance aid. The configuration will support testing of a plurality of weapon replaceable assemblies utilizing only a few passive interconnection elements, without additional modification or the need to reconfigure for specific weapon replaceable assembly test programs. All system elements are packaged in transit cases to safeguard each element during deployment, and the automatic test system can be assembled into its operational configuration in approximately fifteen minutes.

The instrumentation illustrated in the drawings are specific for one particular designed application, and may be different in other applications.

Figure 2:
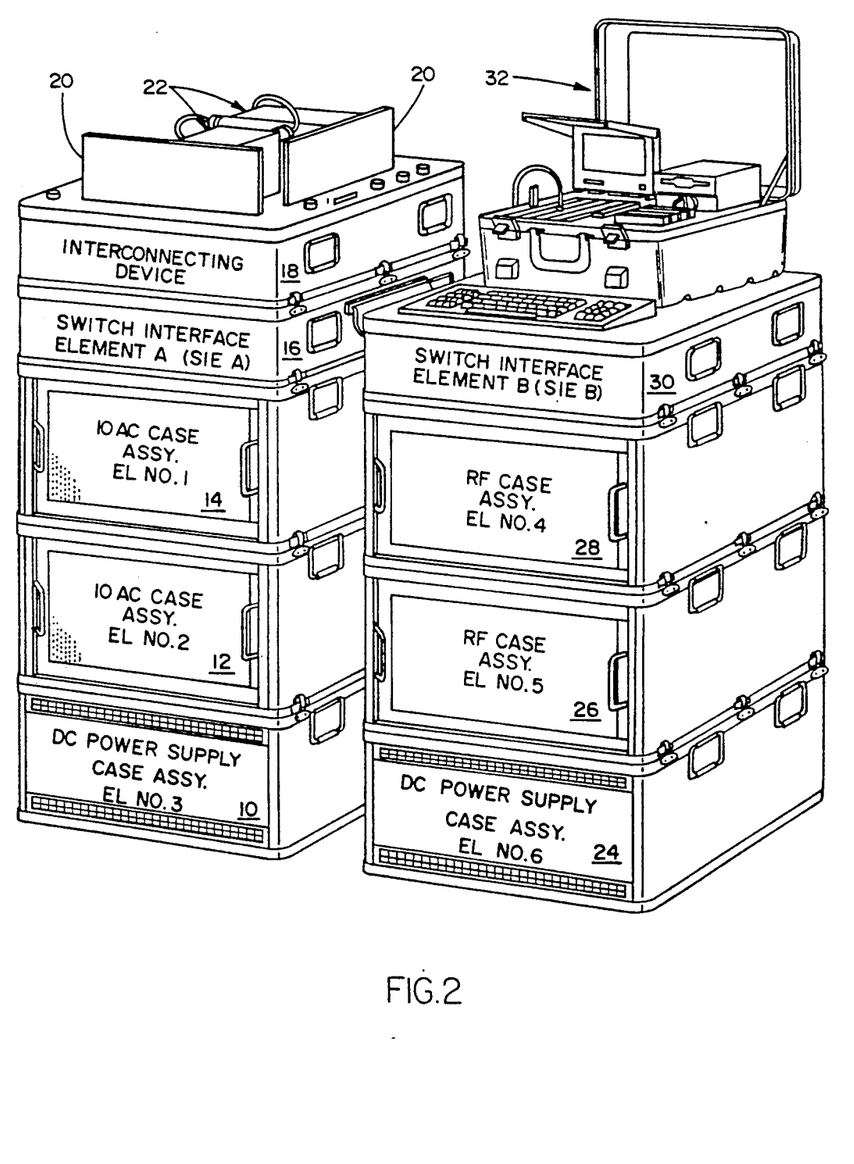
FIG. 2 illustrates an assembled embodiment of the present invention similar to FIG. 1, with a unit under test being mounted on a passive interconnection device which is mounted on top of a switch interface element.
Figure 4:
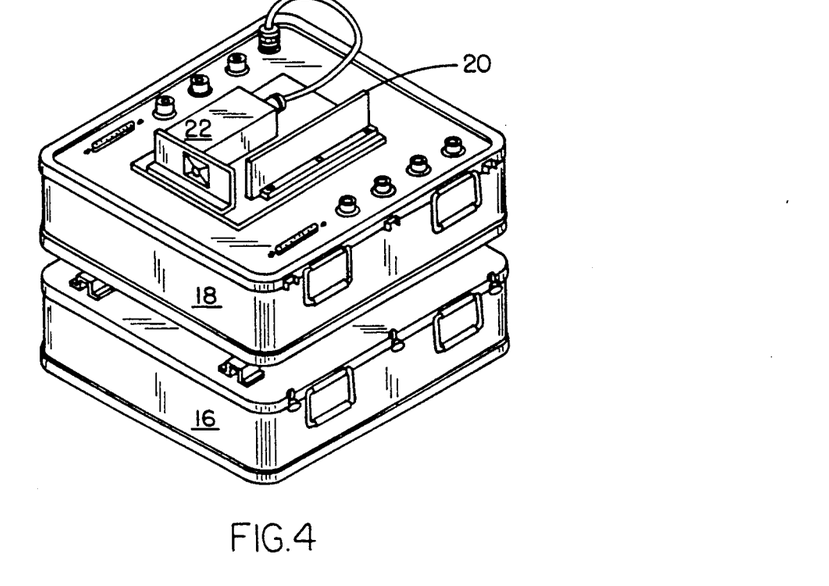
FIG. 4 illustrates further details of one switch interface or interconnection element and the passive interconnection element, with a unit under test being mounted thereon.

The six instrument elements comprise a DC power supply element 10, on top of which is mounted an instrument case 12 having the typical instrumentation illustrated in FIG. 1, on top of which is mounted another instrument case 14 also having the typical instrumentation illustrated in FIG. 1, on top of which is mounted a first switch interface element 16. A passive interconnection element 18 mounts on top of element 16, and has a universal holding fixture 20 mounted thereon which secures and holds a unit under test 22, in a manner as illustrated in FIGS. 2 and 4. The instrument elements further comprise an AC power supply element 24, on top of which is mounted an instrument case 26 having the typical instrumentation illustrated in FIG. 1, on top of which is mounted an instrument case 28, also having the typical instrumentation illustrated in FIG. 1, on top of which is mounted a second switch interface element 30. A system controller and portable maintenance aid 32 and an entry keyboard 34 are shown mounted on the element 30.

Figure 3:
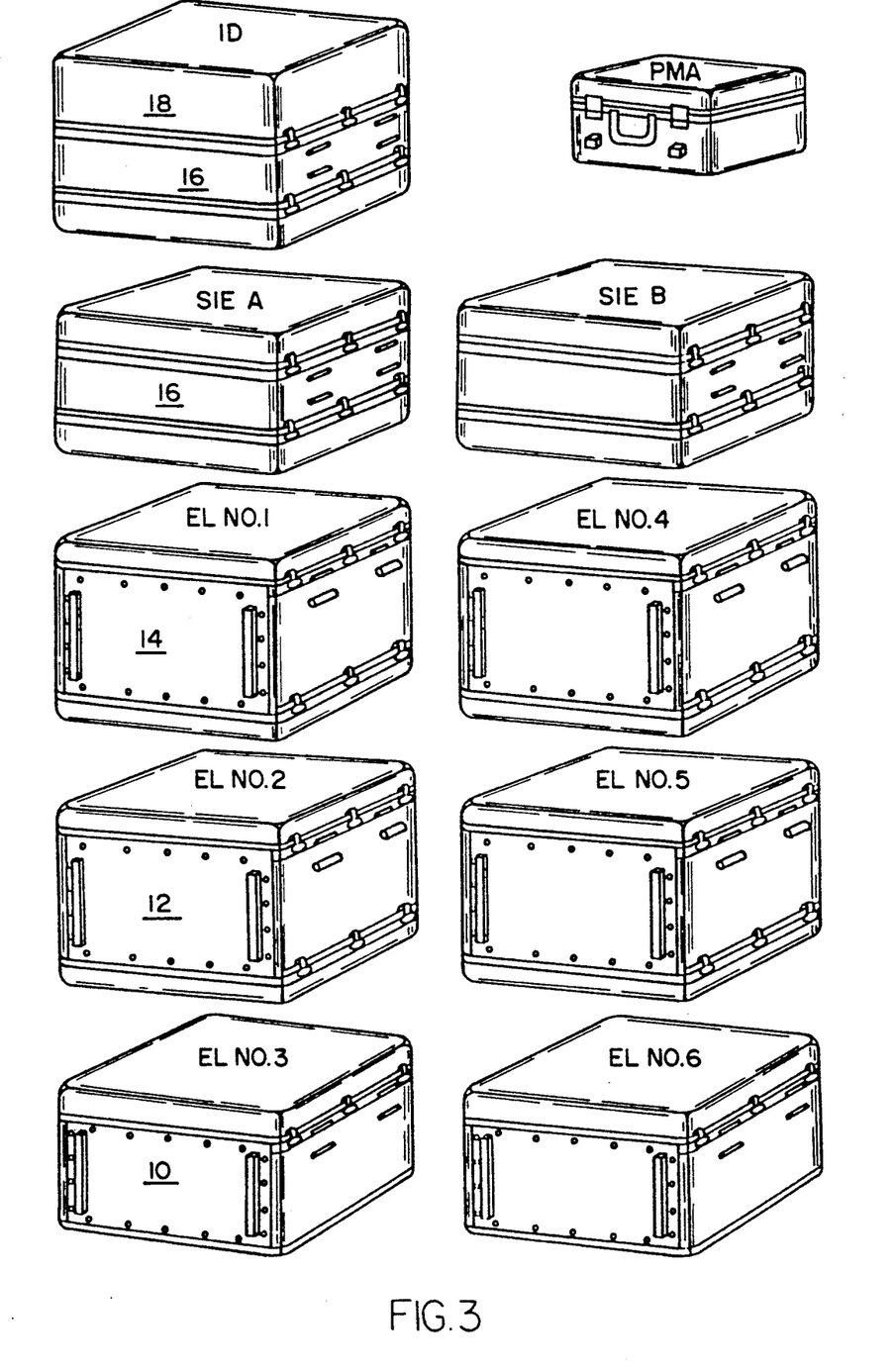
FIG. 3 depicts the transit configuration of the individual elements of the automatic test system of FIG. 1.

The test system consists of six modular instrumentation elements and two switch interface elements. The elements are joined at their interfaces by tongue and groove mating extrusions, and are secured by quick latching strap clamps. The elements function as both transit and instrument cases. In the transit mode illustrated in FIG. 3, the elements are totally enclosed by access covers which are readily removed prior to assembly. With the covers installed, the elements are suitable shipping containers, and can be shipped or stored without additional preparation. Each portable automatic test system modular element is deployable to sites by all common carriers. The modules are portable by two people with a maximum weight of 45 kg. The portable automatic test system has been designed to be completely assembled without the need for external cables. The only cables required for operation of the tester is a bus cable for operation of the system controller, and one cable connecting the two stacked assemblies illustrated in FIG. 1, extending between the backs of the two switching interface elements.

Figure 5:
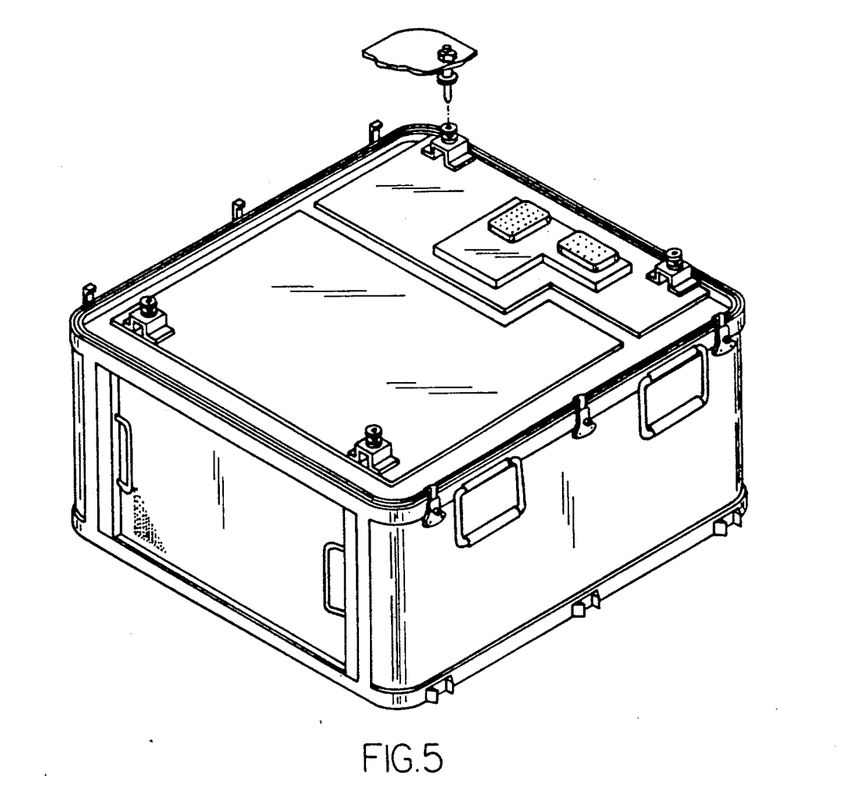
FIG. 5 illustrates details of a typical modular element interface, showing the registration pin alignment therefor and also the several electrical connections and latching clamps therefor.

Each element of the portable and deployable automatic test system is interconnected by a stacking mechanism, as illustrated in FIG. 5, in which:

engagement and alignment is made by guide pins;

the retainers are spring-loaded to offset the case weight during engagement;

an accurately machined mounting platform assures registration relative to guide pins during assembly;

self-aligning tongue and groove extrusion is provided; and six quarter-turn latching clamps are provided for positive element locking.

The portable automatic test system does not require external cables between adjacent modular elements to interconnect the elements. All signals are passed from element to element by two connector types. Zero Insertion Force (ZIF) connectors are used to connect high pin quantities (500 to 1,000) of medium frequency signals (10 MHz or less) with current requirements of one ampere or less. Low Insertion Force (LIF) connectors house power and coaxial pins and provide high frequency, controlled impedance, and high current connections.

Portable automatic test system assembly, with no more than two operators, is accomplished as follows with the times indicated:

| Assembly Steps | Time Required (Minutes) |
|---|---|
| 1. Remove top covers of individual elements | 4 |
| 2. Stack elements in two columns and latch | 4 |
| 3. Connect column switch interface elements A and B by a cable between the backs thereof | 1 |
| 4. Engage element interconnecting connectors | 3 |
| 5. Position and connect the system controller/ portable maintenance aid | 2 |
| 6. Power on initiates self test | 1 |
| Assembly Time = | 15 |

No special tooling or external cables between adjacent modular elements are required.

The tops of switch interface elements A and B provide work surfaces for the portable automatic test system. The switch interface elements provide a 3.72m² horizontal work surface area for attachment of the interface devices.

Figure 6:
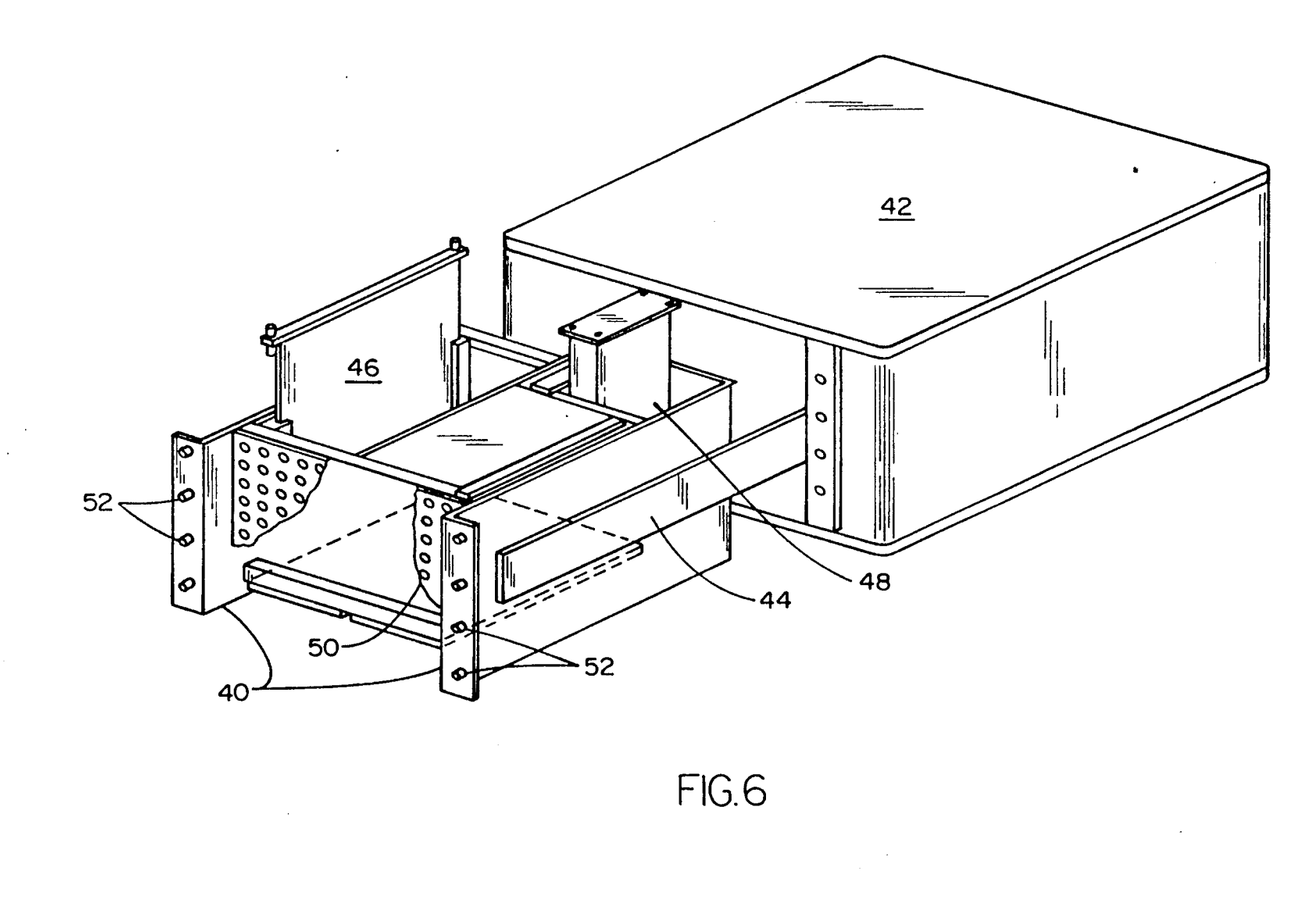
FIG. 6 depicts a front drawer design of one of the instrument elements of the system, showing the front drawer accessibility, of the circuit boards therein for repair and maintenance.

All portable automatic test system modular elements are accessible by a front panel file drawer design as shown in FIG. 6. Once the technician has gained access to the replaceable modules, no special tools are required for replacement. The portable automatic test system contains its own calibration module for periodic calibration, thus eliminating the need to deploy special calibration equipment.

As illustrated in FIG. 6, each modular instrument element can be constructed to provide for easy accessibility and replacement of many of the circuit boards therein. All of the electronics therein is mounted on a drawer structure 40 which slides forward relative to the element housing 42 by drawer runners 44. The electronics typically includes a plurality of circuit boards 46, each of which includes an instrument on a card, and a power supply circuit board 48. Ventilating and cooling air is provided for the electronic elements and flows from the front to the back of the drawer, passing through an air filter 50. A plurality of card cage drawer release captive fasteners 52 are provided at the front of the drawer to provide for easy access to all of the elements therein.

FIG. 1 illustrates the portable automatic test system hardware system, and also shows all of the physical hardware elements and the assets resident within each element, as follows:

A system controller provides the user interface, and also doubles as a portable maintenance aid;

A passive interconnection element functions as an interface to the unit under test;

A switch interconnection element contains RF switching, cross-point switching and digital stimulus and response. Providing the digital stimulus directly behind the interface eliminates the need for buffers and drivers which are typical in many existing active interconnecting devices;

The portable automatic test system provides six portable elements containing electronics and assets as illustrated in FIG. 1, and weapon replaceable assembly-specific cards replace active interconnecting devices and redundant assets for increased availability and built in calibration; and Rapid setup is provided in approximately 15 minutes, with almost all interconnections being internal, providing a ruggedized design for forward deployment missions.

Two switch interconnection elements switch signals from the portable automatic test system instruments to interface pins on the top of the switch interface elements. A first switch interface element A switches the general purpose instruments from the system to the unit under test. A second switch interface element B switches the RF instruments to a dedicated interface for testing units under test with RF requirements.

The switch interface element A houses the heart of the switching and digital subsystems, and it also provides the signal interface to the passive interconnection element, providing several different pin types. The signal interface has solid pins for general purpose signals, coaxial pins for high frequency, controlled impedance signals, and power pins for low frequency high current signals. The switch interface element B interfaces an RF unit under test with RF instrumentation in the portable automatic test system. Whenever the unit under test output power exceeds +30 dBm, the signal is routed through an appropriate set of power loads. Sample signals from these loads are directed to the RF instrumentation for further analysis. The RF controller is capable of performing automatic compensation for power losses, as well as routing paths that need to be phase matched for accurate phase measurements. Appropriately, the switch interface element B is provided with coaxial and waveguide inputs and outputs.

The design of the portable automatic test system is such that no active circuitry is required in the interconnecting device to test any unit under test, accordingly this device is referred to as a passive interconnection element. The top of the passive interconnection element has connectors for cables which connect to the unit under test. The bottom of the passive interconnection element contains two sets of interface connectors 180 degrees apart which connect to the switch interface element. These connectors comprise a mixture of signal, coaxial and power pins to meet both the diagnostic and fault isolation test requirements of the units under test, and the 180 degree symmetrical placement provides double the input/outputs for connection to units under test.

In one designed embodiment, only 8 passive interconnection elements were designed to support 55 weapon replaceable assemblies. Only a single universal holding fixture is needed for forward deployed testing. The number of passive interconnection elements are minimized by: grouping of units under test with similar input/output characteristics and connector requirements on the same passive interconnection element; elimination of all specific circuitry for a particular unit under test from the passive interconnection element; and providing two system interfaces 180 degrees apart on each passive interconnection element, thereby doubling the inputs/outputs available to support testing of units under test.

In one designed embodiment, this design approach resulted in 283 switched input/output pins at the system interface, and moved all of the active interconnecting device hardware in the unit under test-specific electronics within the portable automatic test system, which results in a minimum number of passive interconnection elements for the portable automatic test system.

Considering the documentation requirements in forward deployment, the physical magnitude of hardcopy documentation presents problems that current automatic test systems have not addressed. The portable automatic test system of the present invention eliminates all hardcopy documentation, and replaces it with an electronic data delivery system stored on optical disks. The addition of the optical disks and appropriate system software eliminates paper documentation for the deployed automatic test system. Moreover, appropriate documentation is tied to the diagnostic process to enhance operating efficiency. Technical information is merged with graphics to supply the operator with clear illustrations and a clear picture of requested actions. Tutorial capabilities are used to assist the novice technician, as well as allowing experienced technicians to pick and choose the frames of information required.

Independent test procedures called atomic tests allow the test program to be organized into standalone or separately executable segments that can be executed in a number of different sequences. When no prior data is available for fault detection and isolation, the system executes tests in an end-to-end order, similar to existing test programs. But when a priori knowledge is available or maintenance data is built into a historical data base, more time efficient sequencing is introduced. When ready-for-installation testing is required, a fixed ordered end-to-end sequence is followed.

Figure 7:
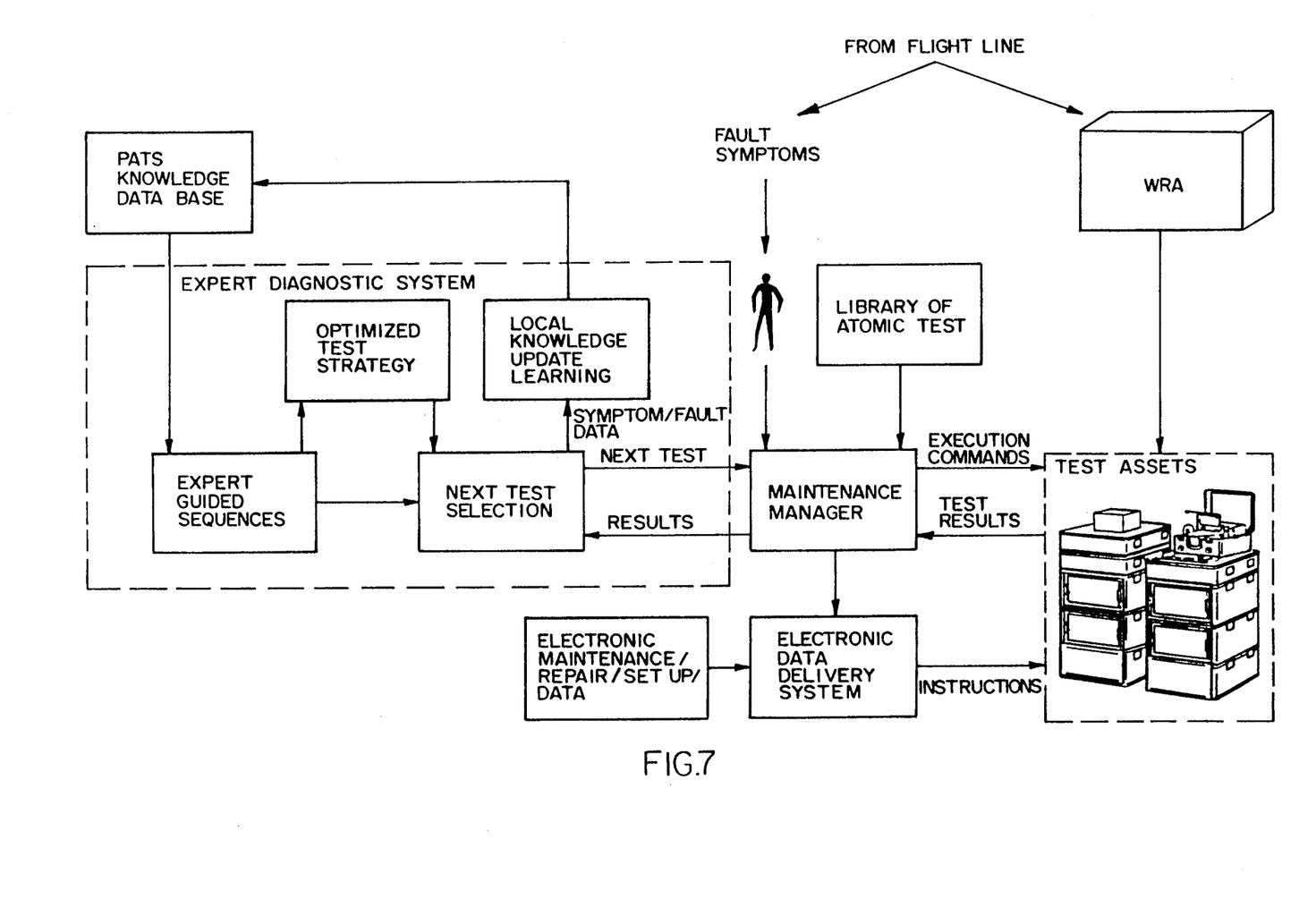
FIG. 7 is a block diagram illustrating the operational approach of the automatic test system of the subject invention.

The portable automatic test system operational scenario, as depicted in FIG. 7, starts with the system receiving fault symptom information from the technician. This a priori information is passed to an expert diagnostic system to select the optimal test to run based upon the fault symptoms and historical data. The test number is given to a maintenance manager which retrieves the atomic test from a library of atomic tests. The library is a collection of independent test procedures which allows the expert diagnostic system to order the test sequence based upon fault symptoms. Once the maintenance manager executes the test, the results are passed back to the expert diagnostic system for the next test selection. This process continues until the expert diagnostic system isolates the fault, and a replacement assembly is designated.

The maintenance manager is also equipped with a spares inventory database to determine if the faulty element is available for repair. The expert diagnostic system is accessed to provide electronic information pertinent to the diagnostics process to the level required by the technician. When completed, the maintenance manager executes a fixed sequence end-to-end test to provide a ready-for-installation status for the weapon replaceable assembly, and updates the knowledge base for the diagnostic session.

The portable automatic test system software performs the following major functions:

A maintenance manager provides asset control, user interface, spares inventory, and network communication;

An electronic data delivery system provides all technical information pertinent to the diagnostic process, tutorial capabilities, and context-sensitive help utilities;

An expert diagnostic system provides for fault detection and isolation, and a fixed sequence ready-for-installation capability;

A historical database makes the diagnostic process more efficient; and

A real-time operating system.

The portable automatic test system provides the following technical information electronically to the operator to enhance efficiency: portable automatic test system setup/teardown instructions; portable automatic test system maintenance instructions (remove and replace); weapon replaceable assemblies setup/teardown instructions; weapon replaceable assemblies maintenance instructions (remove and replace); and tutorial capabilities.

The portable automatic test system controller provides a dual function at the forward deployable test site, providing support for the technicians and organization level maintenance. The system controller provides information and diagnostic tools necessary to perform additional testing of the weapons system. All technical manuals for the weapons system are stored on protected optical disks with instantaneous access being provided for information pertinent to the diagnostic process. The technician is also able to connect the system controller to the weapons system bus to supplement the weapons system's internal tests. By using the portable automatic test system controller as a portable maintenance aid device, the technician has several additional tools available with which to carry out maintenance tasks and weapon replaceable assembly fault isolation testing on the weapons system.

The portable automatic test system utilizes standard bus architectures, such as IEEE-488, VME, VXI, SCSI and RS-232C, to allow it to easily take advantage of upwards compatible technological advancements such as erasable optical disks, battery powered portable maintenance aids, new IOACs, etc.

The modular design of the hardware and software eases the training burden, and allows easy reconfiguration for new weapon systems.

A touch-sensitive interface is provided on the flat panel display of the portable automatic test system controller to allow the operator to retrieve and observe text and graphical data. A touch-sensitive AC thin film electroluminescent flat panel display is capable of displaying a minimum of 1,920 standard ASCII characters, as well as vectors, circles and rectangles at any specific coordinates. Any of the individual pixels may also be turned on or off under software control. The flat panel display provides an integrated touch-sensitive screen within an active display area of 200 mm by 122 mm. The touch screen electronic controller communicates with the host CPU subsystem via an RS-232C serial interface. Touch screen buttons (8 by 8 pixel minimum), are generated through software control, and can be positioned at any coordinates on the screen. The touch screen allows the operator to select program options by touching the display with a thin solid object such as a pen or finger, without being restricted to using only the keyboard for data entry. The portable automatic test system also provides the capability for connection of a large screen color CRT monitor to allow easier viewing of text graphics. The test system contains a detachable, full function alphanumeric keyboard. The keyboard provides full 128 character ASCII encoding through a minimum 66 key arrangement of 55 standard keys and an 11-key numeric keypad. The numeric keypad also provides display cursor control through the use of arrow keys. Keyboard data is outputted to the system controller via an RS-232C serial bus over a cable.

Electronic data for the portable automatic test system is stored on optical disk cartridges which store a minimum of 940 Mbytes of data per cartridge. The cartridge size is a maximum 82.55 mm high by 146.05 mm wide and 11.11 mm thick and weighs only 160 grams. The automatic test system provides storage for at least four cartridges, allowing a minimum capacity of 3.8 Gbytes of information to be transportable with the automatic test system. An entire A4 sized page of ASCII text requires approximately 4Kbytes of storage, which means that an operator can have available a minimum of 940 thousand pages of information.

The test system also provides a modem to communicate with the test system host computer via an internal, independent RS-232C serial bus at standard baud rates of 300, 1200 or 2400 bps. Modem connections for a phone set and wall line are available to the user externally through standard telephone 4 pin input/output jacks.

The portable automatic test system contains two independent IEEE-488-1978 interface buses. The IEEE-488 channels are implemented via two General-Purpose Interface Bus (GPIB) controllers, each with a separate direct memory access controller. This hardware configuration allows each IEEE-488 channel to perform memory-memory, memory-GPIB and GBIP-memory data transfers over a 16 bit data bus interfaced directly to the portable automatic test system controller host CPU. Each IEEE-488 channel operates independently and is capable of supporting full talker, listener and system controller functions. Each channel is provided externally via a standard 24-pin D-type connector. Therefore, the automatic test system is capable of communicating with additional test systems and instruments utilizing the IEEE-488 standard, including VME and VXI bus based systems.

The test system contains two RS-232C serial interface buses available to the system operator. Each RS-232C channel operates independently and is accessed externally via standard 25-pin D-type input/output connectors. Each channel is implemented using a multi-protocol, serial communications controller, capable of supporting full asynchronous or synchronous modes of operation. Each channel is fully programmable to accommodate standard baud rates of 110 to 19,200 bps, as well as providing 7 or 8 bit parity and 1 or 2 even or odd stop bits. Therefore, each RS-232C bus may be configured to communicate with any external equipment containing a serial interface conforming to the RS-232C standard.

The test system contains a MDC3818/MIL-STD-1553B interface bus, with two channels capable of operating independently or in a dual redundant mode configuration. The bus is capable of operating as a 1553B bus controller, remote terminal or bus monitor.

The portable automatic test system is a self-contained unit which provides a lightweight, portable and ruggedized construction, built-in maintainability with front accessibility, standalone shippable modular elements, and minimizes external cabling by providing electrical system interfaces by stacking.

An expert diagnostic system capability is provided as part of the portable automatic test system maintenance management system, and uses historical fault data and dynamically emerging fault symptoms to select the optimized next test strategy for the maintenance manager.

The expert diagnostic system is a device-independent tool that utilizes a library of data and knowledge about specific units under test. This data is contained in the unit under test program as supplemented by a historical data base. The unit under test program consists of independently executable atomic tests that can be executed in a flexible, dynamic order In the past, typical test program sequences consisted of rigid, fixed sequence test strategies that could not be altered at run time to take advantage of increased knowledge about the performance of the units under test. This would result in entire test programs being run for every possible fault, with a possible worst case scenario being that the last test in the strategy is the only test required to detect the faulty component. The expert diagnostic system, on the other hand, provides a comprehensive maintenance support tool for improving the diagnostic capability of new and converted test program sequences. The expert diagnostic system interacts with the maintenance manager throughout fault detection/isolation by performing on-line reasoning based on current test results and historical records. The expert diagnostic system orders test execution, and evaluates test results without technician interaction whenever possible. The expert diagnostic system provides a technician interface which allows justification, explanation, and technician direction of fault isolation. However, this is not the primary mode of operation. The expert diagnostic system is able to analyze previous fault isolation sessions to update its reasoning process based on information stored in the historical data base.

While a preferred embodiment and several variations of the present invention for a portable and deployable automatic test system are described in detail herein, it should be apparent that the disclosure and teachings of the present invention will suggest many alternative designs to those skilled in the art.

What is claimed is:

1. A portable and deployable automatic test system, comprising a plurality of system modular elements, including a plurality of modular instrument elements, at least one modular switching element, and a modular system controller element, each of which modular elements comprises a modular element housing having a bottom and side housing surfaces, and the top of each modular element housing being closed by a top cover for shipping and deployment which is removed for assembly of the system, said system modular elements being assembled by being stacked one upon the other, and including corresponding and aligned electrical connectors in the top and bottom of adjacent stacked modular elements such that electrical signals are passed between adjacent stacked modular elements by the corresponding connectors which are coupled together by stacking of the adjacent modular elements, eliminating the need for external interconnecting cables.

2. A portable and deployable automatic test system as claimed in claim 1, said corresponding connectors including zero insertion force connectors for medium frequency signals of low current, and low insertion force connectors for high frequency, controlled impedance and high current signals.

3. A portable and deployable automatic test system as claimed in claim 1, said system modular elements comprising first and second switching interface elements, said first switching interface element being for low frequency signals, and said second switching interface element being for radio frequency signals.

4. A portable and deployable automatic test system as claimed in claim 3, said first switching interface element providing switching between general test instruments and a first unit under test, and said second switching interface element providing switching between radio frequency instruments and a unit under test which can be a second unit or the first unit at a later time, and including coaxial and waveguide inputs and outputs.

5. A portable and deployable automatic test system as claimed in claim 1, wherein said system controller element also comprises a portable maintenance aid element which provides portable testing and maintenance functions by itself as a stand-alone element without additional system modular elements.

6. A portable and deployable automatic test system as claimed in claim 1, further including at least one passive interconnection element, having a plurality of input/output connections, stacked upon and coupled to a switch connection element in either one of two 180 degree positions, thereby increasing the number of input/output connections available through said passive interconnection element to support testing of units under test placed thereon.

7. A portable and deployable automatic test system as claimed in claim 6, said passive interconnection element including radio frequency switching, cross-point switching, and digital stimulus and response.

8. A portable and deployable automatic test system as claimed in claim 1, at least one instrument element comprising a front drawer design wherein all of the electronics therein is mounted on a drawer which slides forward on drawer runners relative to the housing of the instrument element, such that the drawer can be opened to allow access to replaceable electronic modules positioned therein.

9. A portable and deployable automatic test system as claimed in claim 1, one instrument element including a calibration module provided for calibration of the electronics in the instrument elements.

10. A portable and deployable automatic test system as claimed in claim 1, said system controller element including an optical disk reader for reading information stored on optical disk cartridges, to eliminate hardcopy documentation and provide an electronic data delivery system.

* * * * *